(12) United States Patent
Taft et al.

(10) Patent No.: US 6,584,989 B2
(45) Date of Patent: Jul. 1, 2003

(54) APPARATUS AND METHOD FOR WET CLEANING

(75) Inventors: Charles J. Taft, Wappingers Falls, NY (US); Kenneth J. McCullough, Fishkill, NY (US); George F. Ouimet, Millbrook, NY (US); David L. Rath, Stormville, NY (US); Robert W. Zigner, Jr., Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 09/836,039

(22) Filed: Apr. 17, 2001

(65) Prior Publication Data

US 2002/0148485 A1 Oct. 17, 2002

(51) Int. Cl.[7] .............................. B08B 3/00; B08B 7/04
(52) U.S. Cl. ................... 134/100.1; 134/18; 134/57 R; 134/902
(58) Field of Search ............................... 134/902, 57 R, 134/100.1, 18

(56) References Cited

U.S. PATENT DOCUMENTS

| | | |
|---|---|---|
| 3,607,549 A | 9/1971 | Bielefeld et al. |
| 3,768,499 A | 10/1973 | Dziomba et al. |
| 3,951,711 A | 4/1976 | Snyder |
| 3,964,956 A | 6/1976 | Snyder |
| 4,055,751 A | 10/1977 | Bussmann et al. |
| 4,068,677 A | 1/1978 | De Steur et al. |
| 4,132,585 A | 1/1979 | Oxford |
| 4,276,268 A | 6/1981 | Welsh et al. |
| 4,292,039 A | 9/1981 | Farris et al. |
| 4,749,552 A | 6/1988 | Sakisako et al. |
| 4,778,532 A | 10/1988 | McConnell et al. |
| 4,899,767 A | 2/1990 | McConnell et al. |
| 4,911,761 A | 3/1990 | McConnell et al. |
| 4,917,123 A | 4/1990 | McConnell et al. |
| 4,984,597 A | 1/1991 | McConnell et al. |
| 5,275,184 A | 1/1994 | Nishizawa et al. |
| 5,353,821 A | 10/1994 | Franklin |
| 5,404,893 A | 4/1995 | Brady et al. |
| 5,507,305 A | 4/1996 | Franklin |
| 5,520,744 A | 5/1996 | Fujikawa et al. |
| 5,722,441 A | 3/1998 | Teramoto |
| 5,780,363 A | 7/1998 | Delehanty et al. |
| 5,810,940 A | 9/1998 | Fukazawa et al. |
| 5,931,173 A | 8/1999 | Schiele |
| 5,950,645 A | 9/1999 | Olesen et al. |
| 5,983,909 A | 11/1999 | Yeol et al. |
| 6,158,445 A | 12/2000 | Olesen et al. |
| 6,158,447 A | 12/2000 | Kamikawa et al. |
| 6,171,865 B1 | 1/2001 | Weigl et al. |

FOREIGN PATENT DOCUMENTS

JP    0 618 612 A3    3/1994

OTHER PUBLICATIONS

Verhaverbeke et al, Recent Advances in West Processing Technology and Science, MRSSP vol. 386, pp. 4–12. 1995.*

* cited by examiner

Primary Examiner—Alexander Markoff
(74) Attorney, Agent, or Firm—Todd M. C. Li

(57) ABSTRACT

An apparatus and method is described for cleaning semiconductor wafers using a dilute aqueous solution including at least 80% deionized water, sulfuric acid, an oxidant such as hydrogen peroxide, and a small amount of hydrofluoric acid (HF), preferably in the range of about 5 ppm to about 12 ppm. The automated system mixes the water, sulfuric acid, hydrogen peroxide, and HF to form a cleaning solution having a target HF concentration within the preferred range, for example at 8 ppm. Subsequently, the system maintains the HF concentration at least within about 0.5 ppm to about 1 ppm of the target HF concentration. Thus the system allows effective and predictable cleaning of semiconductor wafers while minimizing damage to metal features, and minimizing cost and waste disposal impacts.

16 Claims, 2 Drawing Sheets

APPARATUS AND METHOD FOR WET CLEANING

FIELD OF THE INVENTION

The present invention relates to semiconductor processing, and more particularly to a process and an apparatus for wet cleaning a wafer using a dilute cleaning solution that achieves and maintains the desired characteristics of the cleaning solution.

BACKGROUND OF THE INVENTION

In the manufacturing of semiconductor devices, wafers must be cleaned at various stages in processing. For example, a reactive ion etching (RIE) process may leave inorganic polymer residues on the substrate which would cause electrical or mechanical defects in the semiconductor device if not removed.

RIE is often used to form patterns of metal lines (for example, aluminum, copper, and alloys as known in the art) in a conductive film or layer which will act as wiring or interconnection (for example, terminal vias) for a semiconductor circuit. RIE processes typically involve patterning the conductive layer with a photoresist, and then using a reactive ion etch, where a plasma environment is formed from chemical species including, for example, boron trichloride, HCl gas, $Cl_2$, or other reactive species which etch exposed portions of the conductive layer. However, the RIE process typically leaves a residue around the metal, which, for the example of aluminum lines, includes complex polymeric oxides of aluminum along with chlorine incorporated into the inorganic matrix. This is often referred to as sidewall polymer residue, and its presence is a source of corrosion of the metal lines when exposed to air or humidity. In addition, after a RIE process, sidewall polymers remain on the semiconductor wafer surface. These sidewall polymers, known as "polymer rails" are inorganic in nature and may have various chemical constituents, including aluminum, silicon, titanium, oxygen, carbon and chlorine. Since each of these constituents tend to react and/or interfere with the function of the semiconductor, removal of the sidewall polymers is therefore desirable.

Some prior art cleaning processes used chromium-based phosphoric acid (CP) solutions or other heavy-metal solvents to clean wire and terminal vias after a RIE process. However, such heavy-metal solutions require special handling and associated costs to avoid environmental and health impacts.

More recently, solutions that contain more than eighty percent water by volume are being used, which are both environmentally safer and less costly than heavy-metal (e.g. chromium) based solutions. The primary additional components include sulfuric acid and hydrogen peroxide, and the resulting solution is often referred to as dilute sulfuric peroxide (DSP). Other oxidants, such as ozone, may also be used instead of hydrogen peroxide. For example, Delehanty et al. (U.S. Pat. No. 5,780,363, hereinafter referred to as the Delehanty patent) discloses an aqueous etchant solution containing about 0.01% to about 15% by weight of sulfuric acid, and about 0.01% to about 20% by weight of hydrogen peroxide or about 1 ppm to 30 ppm of ozone, which is effective to remove polymer residues from a substrate, particularly from a chip having aluminum lines. A typical DSP solution may be obtained by mixing about 50 parts deionized water, about 7 parts of standard 30% dilute hydrogen peroxide, and about 3 parts concentrated sulfuric acid, or roughly 92 wt % water, 3 wt % peroxide, and 5 wt % sulfuric acid. However, such mixtures have not been successful in removing all types of polymer rails.

It has been found that the addition of a small amount of hydrofluoric acid (HF) in the range of about 0.1 to about 100 ppm, and preferably about 8 to 10 ppm to create a dilute sulfuric peroxide, hydrofluoric acid (DSPHF) solution, is sufficient to improve the etch rate, and results in more complete removal of sidewall polymers from metal after RIE processing, effectively cleans metal contacts, and can be used for specific applications in copper technology as well as aluminum. However, the small amount of HF in the DSPHF solution may be depleted over time, reducing the effectiveness of the bath, and achieving a relatively constant level of HF concentration over time is difficult to do manually. For example, a DSPHF cleaning solution is disclosed in copending U.S. patent application Ser. No. 08/975,755 filed on Nov. 21, 1997 entitled "Etching Composition and Use Thereof," assigned to the present assignee and which is incorporated by reference in its entirety.

Teruhito et al. (European Patent Application Publication 0 618 612 A3, hereinafter referred to as Teruhito) discloses a method and apparatus for cleaning residues from a semiconductor substrate with the purpose of preventing the cleaning solution from degrading with time. Teruhito appears to describe a concentrated cleaning solution including a sulfuric acid to hydrogen peroxide mixture in the ratio 5:1, with the addition of fluorosulfuric acid ($HSO_3F$) or $SO_2F_2$, and further discloses the use of the cleaning solution at a temperature in the range of 80° C. to 130° C., and preferably at about 100° C. Teruhito discloses that using $HSO_3F$ or $SO_2F_2$, used in preference to HF, acts to release hydrofluoric acid and fluorine ions when the vaporization decreases the amount of fluorine ions which tends to stabilize the etch rate in the preferred range of 0.5–2 nm per minute. Teruhito does not suggest that a very dilute solution containing at least 80% water would be appropriate for cleaning polymer residues on a semiconductor substrate. Teruhito does disclose the use of an infrared detector to monitor fluorine concentration, and a controller which acts to add fluorosulfuric acid for specified periods of time order to maintain the concentration of fluorine at an approximately constant value. However, fluorosulfuric acid is not a commonly available chemical compared to HF. In addition, the monitoring device, controller, and valve mechanism disclosed in Teruhito does not appear to be suitable for accurately detecting and controlling very small amounts of fluorine ion concentrations, for example, in the range of about 5 ppm to about 12 ppm. For example, Teruhito appears to disclose the addition of fluorosulfuric acid to a small reservoir adjacent to the main process tank, and measuring the ion concentration as the fluid circulates through a tube from the small reservoir to the process tank. The applicants of the present invention have found that such an arrangement would not accurately reflect and suggest inaccurately high concentration levels of fluorine ions in the process tank where cleaning would take place. In addition, applicants are not aware of an infra-red detector that is capable of accurately monitoring fluorine ion concentrations in the range of 5 ppm to about 12 ppm.

Kamikawa et al. (U.S. Pat. No. 6,158,447, hereinafter referred to as the Kamikawa patent) discloses a cleaning apparatus that includes a cleaning bath for dipping a semiconductor wafer. The equipment includes chemical supply pipes and a pump for injecting a predetermined amount of chemical, such as dilute hydrofluoric acid (HF), into water. The temperature of the solution is monitored by a sensor, and on the basis of a signal output from the temperature sensor, a diaphram pump is controlled to inject an amount of chemical so that the concentration of the chemical is at a predetermined concentration. However, for the purposes of cleaning polymer residues left over from RIE processing, very small quantities, for example, in the range of 6 ppm to 12 ppm of HF are required, and diaphram pumps as known in the art are not capable of controlling the addition of HF in such small controlled amounts. The Kamikawa patent also does not suggest the need for monitoring the HF concentration.

McConnell et al. (U.S. Pat. No. 4,899,767, hereinafter referred to as the McConnell '767 patent) discloses a system for treating semiconductor wafers using a plurality of different treatment fluids. Sensors are provided to detect fluid level, temperature, and electrical conductivity of the fluids. A metering pump may be included which controls injection of chemicals, and provide for the addition of 49% hydrofluoric acid (HF) to accurately achieve 0.5% (about 5000 ppm) of HF. However, the equipment disclosed by the McConnell '767 patent does not provide for accurate monitoring and control of HF concentrations as low as 6 ppm to 12 ppm (about 0.0006% to about 0.0012%) as required for cleaning with the DSPHF solution. In addition, the equipment disclosed by the McConnell '767 patent is directed to using multiple treatment fluids and is more complicated than necessary for using DSPHF as a cleaning solution.

Fukazawa et al. (U.S. Pat. No. 5,810,940, hereinafter "Fukazawa patent") discloses a method and apparatus for cleaning a semiconductor wafer without exposing it to the atmosphere. The Fukazawa patent discloses an apparatus that includes a controller which controls valves in order to supply cleaning solutions at different times. First, a cleaning vessel is filled with deionized water and a wafer is placed into the cleaning vessel. Then a solution containing about 5 ppm of ozone, or alternatively about 1% by weight of hydrogen peroxide is supplied for a specified time period at a flow rate and gradually replaces the deionized water until the concentration of the ozone solution reaches 4 ppm. The flow of ozone solution is stopped, and the vessel is left in that state for a time period to remove organic materials from the wafer surface. Thereafter, another valve is opened to supply dilute hydrofluoric acid at about 0.2 weight % (which would be equal to about 2000 ppm) for a time period at a flow rate of about 0.5 liters per minute, replacing the previous fluid until the concentration of ozone decreases to about 1 ppm, and the concentration of dilute hydrofluoric acid reaches about 0.1% (or about 1000 ppm of HF). The flow of dilute hydrofluoric acid is then stopped, and the vessel is maintained for a time period of about 5 minutes. This sequence of supplying different solutions at different flow rates and different times acts to remove organic materials (during the flow of ozone solution), to remove oxide formed by the interaction with ozone by means of dilute hydrofluoric acid, and in addition metal impurities such as iron (Fe), aluminum (Al), and copper (Cu) are removed by the mixture of ozone and dilute hydrofluoric acid. Finally, deionized water is used to rinse the wafer. This method and apparatus are not directly applicable for cleaning polymer residues from RIE processing and could damage the aluminum lines or contacts on the wafer. In addition, the continued replacement of fluids is wasteful of cleaning solution, and also does not offer the degree of control over the concentration of HF in a DSPHF solution in the range of about 6 ppm to about 12 ppm of HF, which is desired for cleaning polymer residues from RIE processing.

Nishizawa et al. (U.S. Pat. No. 5,275,184, hereinafter referred to as the Nishizawa patent) discloses a dipping type wafer treatment apparatus capable of forming a uniform rising flow of a treatment fluid from an inlet to an outlet. The treatment solution is supplied from the inlet in the treatment solution bath and drawn off through an outlet of the treatment solution bath, so that the treatment solution can be rapidly substituted and the wafers have no contact with air during the replacement of the treatment solutions. Chemical agents may include $NH_4OH$, HF, HCl, and $H_2O_2$. The desired mixture of chemical agents is obtained by adjusting pump pressure to vary flow rates of each chemical agent from individual containers. There is no provision in the Nishizawa patent for sensing the concentration and then adjusting the concentration based on sensing results. The apparatus of the Nishizawa patent is both more complex and provides less control than is needed for cleaning RIE polymer residues from wafers using a DSPHF solution.

Teramoto (U.S. Pat. No. 5,722,441, hereinafter to as the Teramoto patent) discloses an apparatus for washing semiconductor wafers to remove impurities. The Teramoto patent discloses a washing vessel containing a mixture of hydrofluoric acid, hydrogen peroxide, and water as a process solution, referred to as DHF. The concentration may be monitored by a spectroscope which can send a detection signal to a central processing unit (CPU) which then controls valves to control the amount of chemical component added to the solution. However, spectroscopy is not known to be sensitive enough to detect very small amounts of HF in the range 5 ppm to 12 ppm, and adding HF by the use of valves will not provide sufficient control to maintain HF in the range 5 ppm to 12 ppm as required for the DSPHF cleaning process.

In view of the foregoing discussion, there is a need to provide for a method and apparatus to automatically mix, monitor, and adjust the amount of HF present in a DSPHF solution to optimize the cleaning of polymer residues from metal features on semiconductor wafers and without damaging the metal lines, and in addition, provide monitoring and control of HF concentration in the range from about 5 ppm to about 12 ppm in order to maintain effectiveness and consistency of the cleaning process for production cleaning of many wafers, while minimizing costs and environmental impacts.

SUMMARY OF THE INVENTION

The present invention addresses the above-described need by providing a method and apparatus for automatically blending and maintaining a customized semiconductor cleaning solution that includes small, but critical amounts of HF.

This invention solves the problem of uneven concentrations of HF in a dilute sulfuric peroxide, hydrofluoric (DSPHF) solution by automatically monitoring and adjusting the bath to maintain the concentration of HF to within plus or minus 1.0 ppm, and preferably within plus or minus 0.5 ppm of the target HF concentration.

This invention has the further objective of automatically maintaining the concentration of an active component, such as HF, in a cleaning solution, such as DSPHF, which may become depleted in HF or other desired small quantities of an active component over time through normal usage, thus reducing costs and waste disposal problems.

According to one aspect of the present invention, an apparatus for cleaning semiconductor wafers using a dilute sulfuric peroxide hydrofluoric (DSPHF) acid solution is described. A process tank is provided containing a cleaning solution including deionized water, sulfuric acid, and hydrogen peroxide. A monitoring system is provided for measuring the fluorine ion concentration in the cleaning solution at least more than once, and possibly continuously over time. The monitoring system is capable of accurately detecting amounts of HF as low as about 3 ppm with accuracy better than about ±0.5 ppm. A controller is provided which responds to the concentration levels detected by the monitoring device, and thereby controls a pumping device to initially mix HF into the cleaning solution to achieve a target concentration of fluorine ions and thereafter maintain the HF concentration at substantially a constant level. The pumping device is capable of providing small metered amounts of dilute HF solution, for example in 20 $\mu l$ units or spikes. A source of dilute HF is provided, for example, by taking a standard 49% by weight solution of HF and further diluting it with deionized water at a ration of 10 parts deionized water to 1 part 49% dilute HF solution. Such a system provides for a solution that is consistently effective and predictable for cleaning residues from semiconductor wafers without damage to the metal features, and with minimal cost and waste disposal impacts.

According to another aspect of the present invention, the cleaning apparatus may further include a mixing tank for premixing a solution including deionized water, sulfuric acid, and hydrogen peroxide, and transferring the premixed solution to the process tank through a connecting tube, in which the amount of premixed solution is controlled in accordance with a full level sensor. A preferred premixed solution includes 50 parts deionized water, about 3 parts concentrated sulfuric acid, and about 7 parts 30 weight percent hydrogen peroxide.

In accordance with another aspect of the present invention, a controller is provided that controls the pump so as to add HF to quickly achieve an initial target concentration of HF in the cleaning solution when the monitoring system detects a low threshold level of HF, preferably 2 ppm. In addition, the controller also controls the pump to add smaller amounts of HF as required when the fluorine ion concentration in the cleaning solution falls below a low threshold, for example about 0.5 to 1 ppm below the target level, for example in the range 5 ppm to about 12 ppm, and preferably at about 8 ppm. Thus, the concentration level of HF is maintained approximately constantly at a consistent and effective target level.

In accordance with a further aspect of the present invention, a heating element is provided to maintain the temperature of the cleaning solution at a substantially constant temperature, preferably at about 35° C.

In accordance with a further aspect of the present invention, a method of blending and maintaining a solution for cleaning a semiconductor wafer is described which includes premixing a cleaning solution comprising deionized water, sulfuric acid and hydrogen peroxide, transferring said cleaning solution to a process tank, performing over time a plurality of measurements of fluorine ion concentration in said cleaning solution to obtain a measured concentration level associated with each of said measurements, providing a target fluorine ion concentration level, providing an initial threshold concentration level less than said target fluorine ion concentration level, providing a low threshold concentration level greater than said initial threshold and less than said target fluorine ion concentration level, and comparing each of said measured levels to said target and threshold levels, and if said measured concentration level is below said initial threshold, adding a first amount of hydrofluoric acid to said cleaning solution so that said fluorine ion concentration is substantially at said target fluorine ion concentration level, and if said measured concentration is less than said low threshold, adding a second amount of hydrofluoric acid to said cleaning solution until said fluorine ion concentration is substantially at said target fluorine ion concentration level, so that said cleaning solution is initially mixed to have said target fluorine ion concentration level and so that the fluorine ion concentration in said cleaning solution is thereafter maintained substantially at said target fluorine ion concentration level.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In the following descriptions of the preferred embodiments of the invention, a method and apparatus for mixing and maintaining a custom blend solution for cleaning semiconductor wafers will be detailed. It will be appreciated that this is intended as an example only, and that the invention may be practiced with a variety of substrates and metals.

Figure 1:
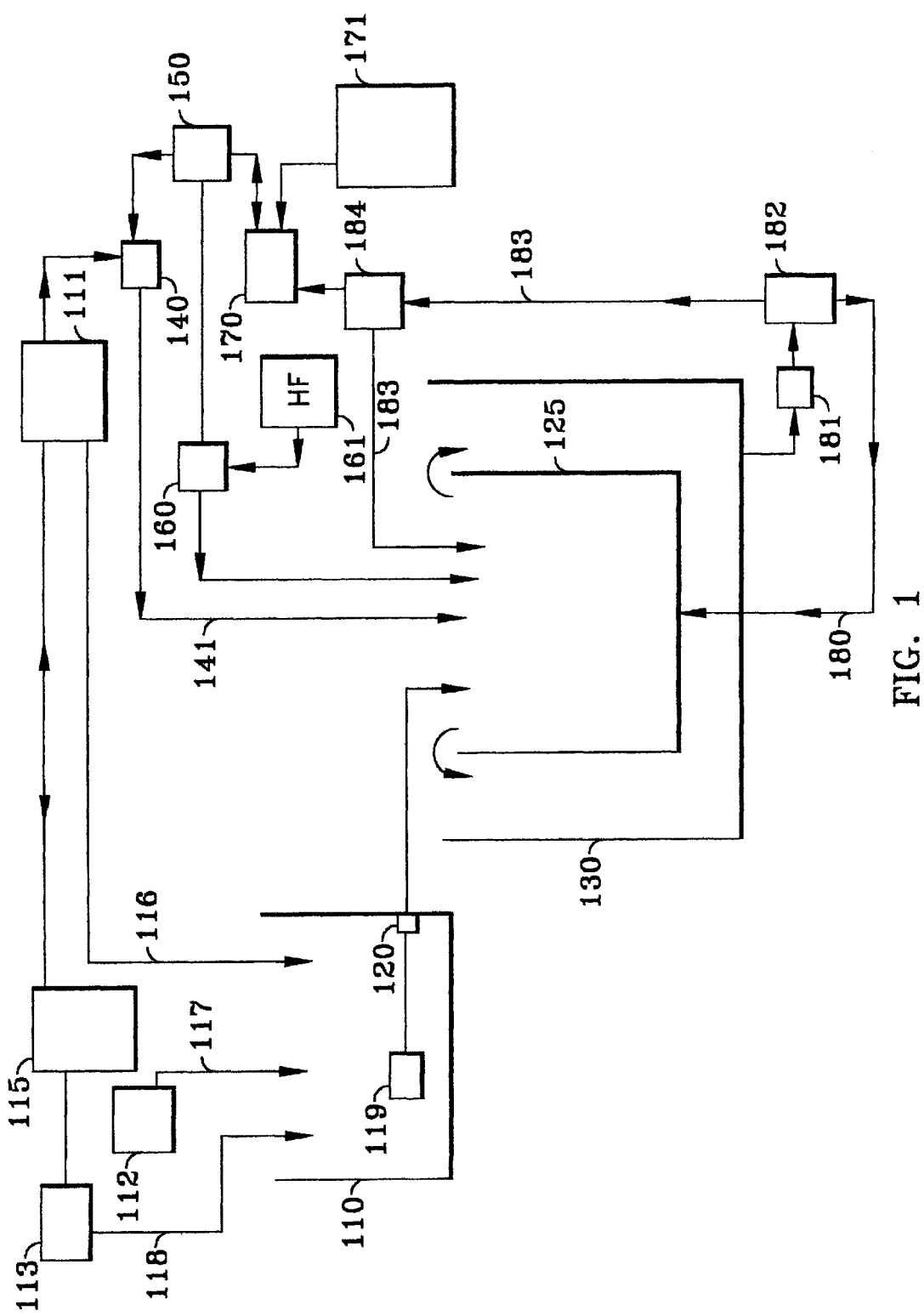
FIG. 1 illustrates an apparatus in accordance with the present invention.

As shown in FIG. 1, a pre-mixing tank 110 is provided in which the base DSP solution is mixed. A typical pre-mixing tank may have a capacity of about 10 gallons. A preferred DSP mixture would have a volumetric ratio of about 50 parts deionized water, about 7 parts of standard 30% dilute hydrogen peroxide, and 3 parts of sulfuric acid. A pre-mixing controller 115 is provided to control both the amount and sequence of mixing, using the specific gravity or weights of the chemical components to determine the appropriate quantities to add. For example, at an ambient temperature of about 30° C., deionized water weighs about 8.3 lbs/gal, 30% dilute hydrogen peroxide weighs 9.2 lbs/gal, and concentrated sulfuric acid weighs about 15 lbs/gal. The controller 115 is thus programmed to add about 64 lbs of deionized water, for example from water source 111 through water pipe 116, followed by the addition of about 10 lbs of standard 30% dilute hydrogen peroxide from a source 112 through a pipe 117. Following the addition of hydrogen peroxide, about 7 lbs of concentrated sulfuric acid is added through pipe 118 from source 113. The system is preferably filled in this sequence in order to safely control the thermal reaction.

A mixing pump 119 is turned on to perform a premix recirculation step for a minimum of about 2 to 5 minutes. Thereafter, the delivery valve 120 is opened and the pump 119 is used to deliver the base pre-mixed DSP solution to the process tank 125 in which a semiconductor wafer (not shown) will later be dipped for cleaning. A typical process tank 125 will have a fill level of about 9 gallons. When the fill level in process tank 125 is reached, the delivery valve 120 is closed. The fluid level may be monitored by techniques known in the art, for example by back pressure sensing through a tube (not shown) inserted at a desired depth within the outer tank 130. In a typical back pressure sensing method, a change in pressure of gas within the tube is detected when the fluid level in the tank covers the opening in the tube. For example, in a standard operation, three back pressure sensing tubes may be used. One such tube is placed at a "Full" level, such that when the fluid reaches the "Full" level indicating a sufficiency of fluid to allow the cleaning process to proceed, a "Full" sensor (not shown) causes the delivery valve 120 to close. Another tube (not shown) would be placed deeper than the "Full" level in the overflow tank 130 at a "Low" level. When a "Low" fluid level is detected, for example when water is depleted by evaporation, the controller 150 can be notified and signal pump 140 to add additional deionized water until the "Full" level is reached again. A third tube (not shown) can be placed above the "Full" level to indicate an "Overfill" condition, which would indicate a system fault, and thereby generate an alarm, which could be used to shut down the system until corrective action can be taken.

When the "Full" level is reached, a recirculation pump 181 is started which directs fluid from the overflow tank 130 through a filter 182 and returns fluid to the process tank 125 through piping 180. The pressure in filter 182 allows a small flow of filtered fluid to flow out of a port (not shown) through tubing 183 and then back to the process tank 125. The tubing 183 in this embodiment is ¼ inch Teflon (TM) tubing but many other types of tubing would be suitable. A sampling valve 184 is connected to the tubing 183 at a point between the pump/filter assembly 182 and the process tank 125. When the recirculation pump 182 starts operation, a titration unit 170 causes the sampling valve 184 to take periodic samples of fluid from the tubing 183.

Initially, when the process tank 125 is first filled with the base DSP solution, there is no HF present in the solution. The titration system is set up to monitor both the concentration of sulfuric acid and the concentration of hydrofluoric acid or HF concentration. For example, in this embodiment, the sulfuric acid concentration is targeted to be at about 0.94 molar weight. The molar weight of sulfuric acid may be determined by standard titration techniques, for example, by adding reagents from a source 171 in amounts which have a known relationship between sulfuric acid molar weight and pH. The pH will not be significantly affected by the small concentrations of HF in the target solution. At this point in the mixing process, the HF content is expected to be less than about 2 ppm or essentially zero because no HF has been added yet. The concentration of HF can be monitored by measuring fluoride ions by techniques known in the art such as standard addition. The standard addition technique involves measuring a change in electrical voltage that is proportional to the log of the fluoride ion concentration.

The controller 150 monitors the output of the titration unit 170, and will detect the fact that HF is below a first predetermined concentration level (for example, 2 ppm of HF) and the controller 150 will send a signal to a micropump 160 to deliver an appropriate amount of HF from a source 161 of dilute (10:1) HF in order to bring the concentration of HF in the process tank 125 up to the desired level. In this embodiment, the range of HF desired for cleaning polymers formed after RIE processing of a metallization is from about 5 ppm to about 12 ppm, with 8 ppm being preferred. A standard micropump 160 may be used, which in this embodiment delivers fluid "spikes" in units of 20 µl per pump cycle or pulse. Therefore, in order to reach the target of 8 ppm of HF in a process tank of 9 gallons (or about 34 liters), the pump 160 is directed by the controller 150 to issue 278 pulses (each pulse containing 20 µl of 10:1 dilute HF) in order to quickly bring the cleaning solution up to the desired level of HF, in this case 8 ppm. In addition, a heating unit (not shown) in process tank 125 is used to bring the temperature of the bath to about 35° C. plus or minus 2 degrees for about 2 minutes. At this point, the solution is ready to be used for cleaning semiconductor wafers.

During normal bath usage, the hydrofluoric acid are monitored at a programmed rate. The hydrofluoric acid will be depleted by reactions with the workpiece cleaned in the process tank 125. When the hydrofluoric acid falls below a second predetermined level, the controller will direct the pump 160 to replenish the HF to the target level, which is preferably 8 ppm for cleaning polymers remaining after a RIE process. In the preferred embodiment, the second predetermined level is about 1 ppm below the target level of HF.

The sulfuric acid concentration is also monitored, but under normal circumstances, the sulfuric acid concentration should not vary significantly from the original specification because little or no sulfuric acid is consumed during the cleaning process. If such a depletion occurs, it may indicate a system fault and the system will produce an alarm indicating "Acid Molarity High" or "Acid Molarity Low." Either of these alarms will be used to shut the system down to prevent any further processing until a corrective action is performed.

Because the process tank 125 may be open to the atmosphere and is heated, the water may evaporate and become depleted. Thus, as discussed above, if the water level falls below the "Full" level, the controller 150 will direct a water pump 140 to add additional deionized water from water source 111 through pipe 141 into the process tank.

Similarly, if the HF level increases above a third predetermined HF threshold, the controller 150 will issue an alarm indicating "HF Concentration High," issue an alarm to shut down the system and prevent any further processing until a corrective action is performed.

Under normal cleaning operations, it is important for process consistency, reliability, and predictability to keep the HF concentration within a predetermined range. The specific preferred range of HF concentration will depend on the particular chemistry of the residue to be cleaned. In the case of polymer residues from RIE processing, the preferred range is about 5 ppm to about 12 ppm of HF, preferably at about 8 ppm plus or mins about 1 ppm. If the HF concentration falls below about 5 ppm, cleaning of the polymer residues will be ineffective, leading to very long processing times, and resulting sidewall roughness with potential degradation in reliability. If the HF concentration rises above about 12 ppm, the solution will tend to etch other materials, such as the metallurgy, in addition to the polymer residue and result in damage to the wafer. Other RIE process conditions will produce residues having different compositions may require different optimal concentrations of HF. The maintenance of this concentration within about 1 ppm of the target concentration is important for process stability, reliability and predictability of the final result.

Thus, the present invention provides an automated method and apparatus to blend and maintain a custom solution for cleaning semiconductor wafers that can be used for long periods of time, reducing the costs of cleaning fluids and minimizing the environmental impacts of waste disposal. In addition, the effectiveness of the cleaning solution uniformly at the target concentrations will greatly improve the reliability of the cleaned semiconductor wafers.

Figure 2:
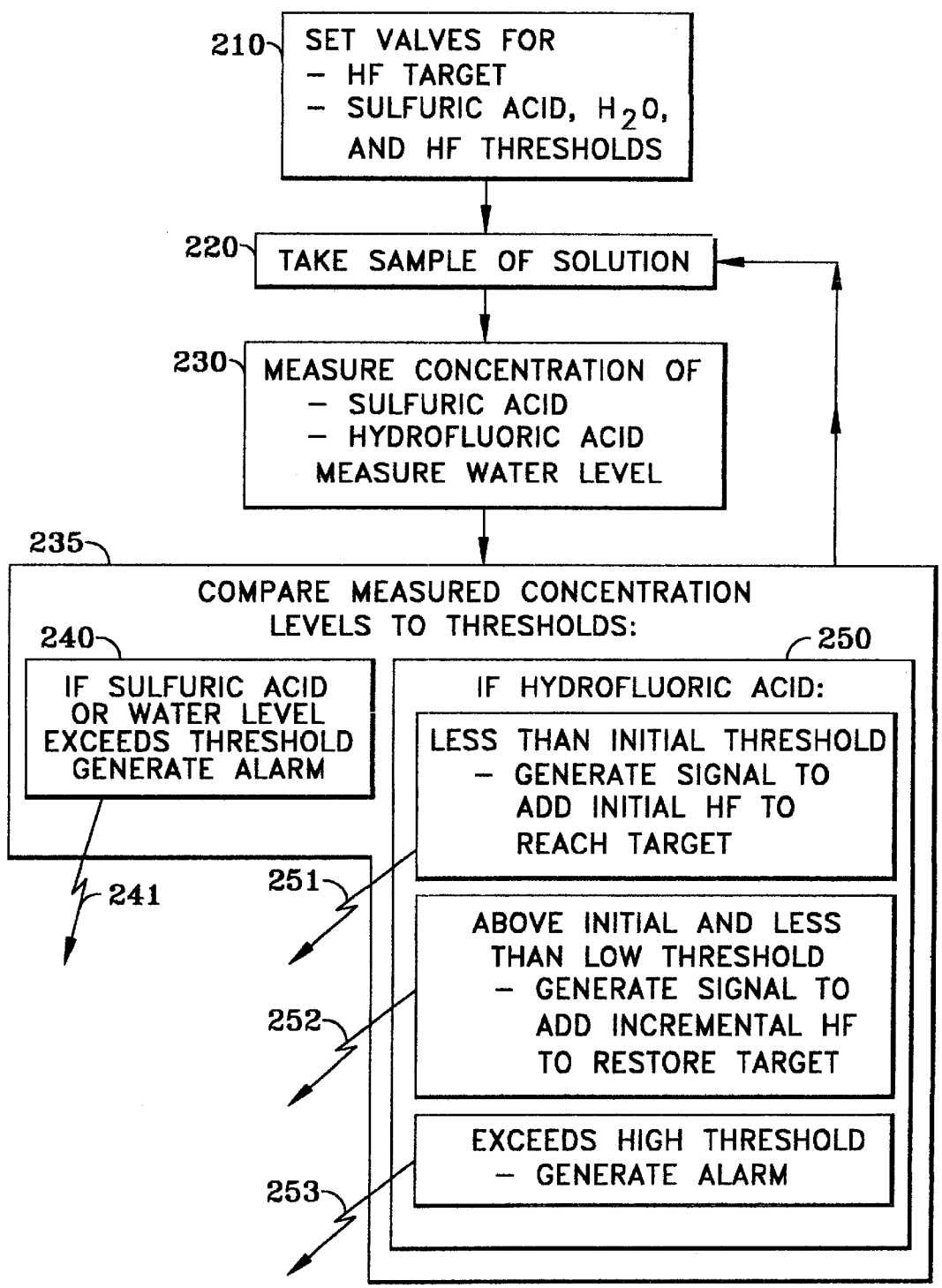
FIG. 2 is a flow chart showing the operation of controller 150 in accordance with the present invention.

FIG. 2 illustrates a flow chart for a computer program that would be used in the controller 150 as part of one embodiment in accordance with the present invention.

Predetermined target and threshold levels for HF concentration, sulfuric acid concentration and solution volume level are programmed into the controller as indicated by Block 210. When the recirculation pump 181 has started operation, fluid is taken from filter 182 and flows through tubing 183 and becomes available for sampling. Thus, the controller 150, in response to a signal from the recirculation pump 181, will direct the titration unit 170 to begin taking periodic samples from the sampling valve 184 (Block 220).

The output from the titration unit 170 is monitored by the controller 150 and compared (Block 235) with the predetermined threshold levels of sulfuric acid, water, and HF. If the sulfuric acid concentration is too low or high (by falling outside of sulfuric acid threshold levels) or the solution level falls below a volume threshold, the controller generates an alarm 241 which will notify appropriate personnel and shut down the system until corrective action is taken (Block 240). More significantly for the present invention, the HF concentration level is monitored against three separate thresholds (Block 250).

The first, or "Initial" HF threshold is indicative of a fresh base DSP solution that has been introduced initially into the process tank 125. In the preferred embodiment, that level is zero, or at least below about 2 ppm. If the controller determines that the HF concentration is below 2 ppm, a first signal 251 is sent to the micropump 160, which is responsive to first signal 251 to dispense a sufficient number of units of dilute HF solution so that the solution in the process tank will be quickly brought up to a target level of HF (Block 250). In this embodiment, for a process tank having a capacity of about 9 gallons, the preferred target is about 8 ppm of HF, and the number of pulses of 10:1 dilute (49%) HF that would be required to reach that target if a 20 $\mu$l pump is used is 278 pulses or "spikes".

If the controller 150 determines that the HF concentration falls below a second concentration threshold, indicating a "Low" level of HF, which is preferably about 1 ppm below the target concentration (i.e., about 7 ppm), but could be about 0.5 ppm or less below the target, then a second signal 252 is sent to the micropump 160 (Block 250). Pump 160 will respond to the second signal 252 by dispensing the appropriate number of pulses (in this embodiment, about 35 spikes) to restore the concentration of HF to the target level (which is 8 ppm for this embodiment).

Finally, if the HF concentration exceeds the target level by an amount exceeding a third threshold, or "High" level, which is preferably about 1 ppm above the target concentration, then the controller 150 issues an alarm 253 to the system controller 150, indicating a system fault, upon which further processing is prevented until a corrective action is taken.

Thus the controller, in accordance with this invention, provides a means to automatically blend and maintain a cleaning solution for semiconductor wafers that can maintain a fine degree of effectiveness and to significantly improve failure rates of the resulting semiconductor devices, while reducing costs and waste disposal impacts.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. An apparatus for cleaning semiconductor wafers using a dilute sulfuric peroxide hydrofluoric acid solution containing more than about 80% water by volume, the apparatus comprising:

a process tank containing a cleaning solution comprising deionized water, sulfuric acid, and hydrogen peroxide;

a monitoring system for performing over time a plurality of measurements of fluorine ion concentration in said cleaning solution to obtain a measured concentration level associated with each of said measurements;

a source of hydrofluoric acid;

a controller responsive to said measured concentration level;

a pumping device responsive to said controller to add a first amount of hydrofluoric acid to said cleaning solution from said source, said first amount of hydrofluoric acid sufficient to achieve a target fluorine ion concentration level and thereafter maintaining said fluorine ion concentration substantially at said target fluorine ion concentration level;

a mixing tank for blending a premixed solution comprising deionized water, sulfuric acid, and hydrogen peroxide;

a tube connecting said mixing tank to said process tank through which said premixed solution is transferred to said process tank; and a valve controller for sensing a full level within said process tank and terminating the transfer of premixed solution when said full level is reached.

2. The apparatus of claim 1 wherein said target fluorine ion concentration level is between about 5 ppm and about 12 ppm.

3. The apparatus of claim 1 wherein said target fluorine ion concentration level is about 8 ppm.

4. The apparatus of claim 1 wherein said cleaning solution comprises about 50 parts deionized water, about 3 parts concentrated sulfuric acid, and about 7 parts 30 weight percent hydrogen peroxide.

5. The apparatus of claim 4 wherein said target fluorine ion concentration level is between about 5 ppm and about 12 ppm.

6. The apparatus of claim 4 wherein said target fluorine ion concentration level is about 8 ppm.

7. The apparatus of claim 1 wherein said process tank further comprises a heating element for maintaining said cleaning solution at a substantially constant temperature.

8. The apparatus of claim 7 wherein said substantially constant temperature is about 35° C.

9. The apparatus of claim 1 wherein said source of hydrofluoric acid contains 10:1 dilute 49 weight percent HF.

10. The apparatus of claim 1 wherein said pumping device delivers hydrofluoric acid in increments of about 20 $\mu$l.

11. The apparatus of claim 1 wherein said monitoring system is capable of detecting fluoride ions at concentrations about 2 ppm with an accuracy of 0.5 ppm or less.

12. An apparatus for cleaning semiconductor wafers using a dilute sulfuric peroxide hydrofluoric acid solution containing more than about 80% water by volume, the apparatus comprising:

a process tank containing a cleaning solution comprising deionized water, sulfuric acid, and hydrogen peroxide;

a monitoring system for performing over time a plurality of measurements of fluorine ion concentration in said cleaning solution to obtain a measured concentration level associated with each of said measurements;

a source of hydrofluoric acid;

a controller responsive to said measured concentration level, wherein said controller generates a first indicator when said measured concentration level is below an initial threshold, said controller further capable of generating a second indicator when said measured concentration level equals or exceeds said target fluorine ion concentration level, wherein said initial threshold is less than said target fluorine ion concentration level, and said controller further capable of generating a third indicator when said measured concentration level is below a third threshold, wherein said low threshold is greater than said initial threshold and less than said target fluorine ion concentration level; and a pumping device responsive to said controller to add a first amount of hydrofluoric acid to said cleaning solution from said source, said first amount of hydrofluoric acid sufficient to achieve a target fluorine ion concentration level and thereafter maintaining said fluorine ion concentration substantially at said target fluorine ion concentration level.

13. The apparatus of claim 12 wherein said target fluorine ion concentration level is between about 5 ppm and about 12 ppm.

14. The apparatus of claim 12 wherein said target fluorine ion level is about 8 ppm.

15. The apparatus of claim 12 wherein said initial threshold is about 2 ppm.

16. The apparatus of claim 12 wherein said low threshold is about 0.5 to about 1 ppm less than said target fluorine ion concentration level.

* * * * *